Aug. 20, 1968 M. E. CAVANAUGH 3,398,324

D-C LOAD SWITCHING AND PROTECTIVE CIRCUITS WITHOUT MECHANICAL CONTACTS

Filed Jan. 18, 1965 2 Sheets-Sheet 1

MARION E. CAVANAUGH
INVENTOR

BY Glenn H. Antrim
AGENT

MARION E. CAVANAUGH
INVENTOR

BY Glenn H. Antrim
AGENT 3,398,324

D-C LOAD SWITCHING AND PROTECTIVE CIRCUITS WITHOUT MECHANICAL CONTACTS

Marion E. Cavanaugh, Dallas, Tex., assignor, by mesne assignments, to LTV Aerospace Corporation, Dallas, Tex., a corporation of Delaware Filed Jan. 18, 1965, Ser. No. 426,007
7 Claims. (Cl. 317—16)

This invention pertains to transistor power switching circuits and particularly to transistor switching circuits that normally consume little power for their operation, that provide current reduction to protect load circuits, and when necessary provide current interruption to protect both the switching circuits and the load.

The switching circuits described herein are particularly applicable in aircraft electrical circuits to replace mechanical switching contacts. The use of transistor switching circuits eliminates transients that usually accompany mechanical contact switching and that interfere with sensitive aircraft electronic communication and control circuits.

An object of this invention is to provide transistor power switching control circuits that, while on, have minimum resistance in series with a load that is to be controlled.

Another object is to provide sufficient current to control circuits of switching transistors to saturate emitter-collector circuits while utilizing a minimum of input power for control purposes.

Figure 1:
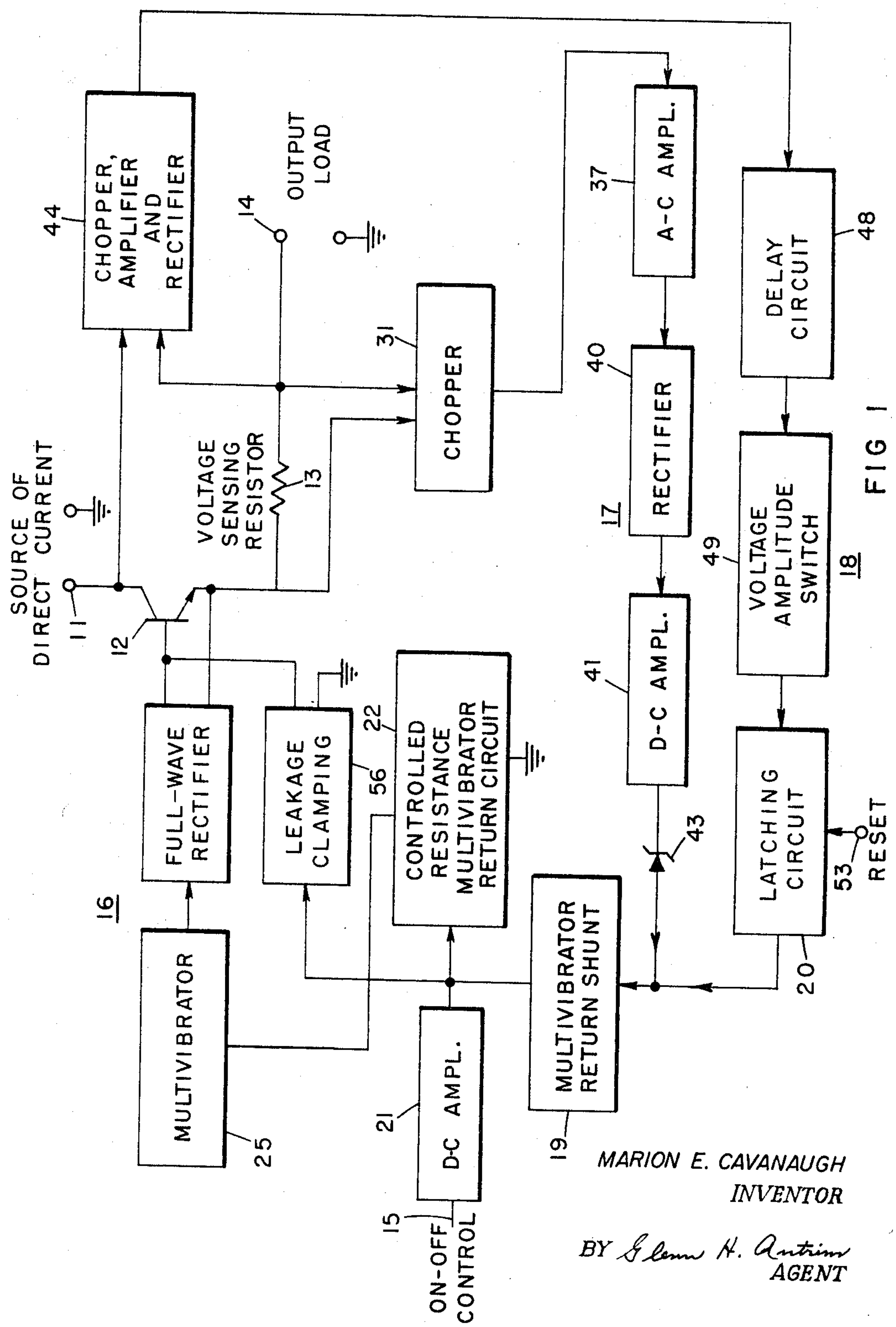
Figure 2:
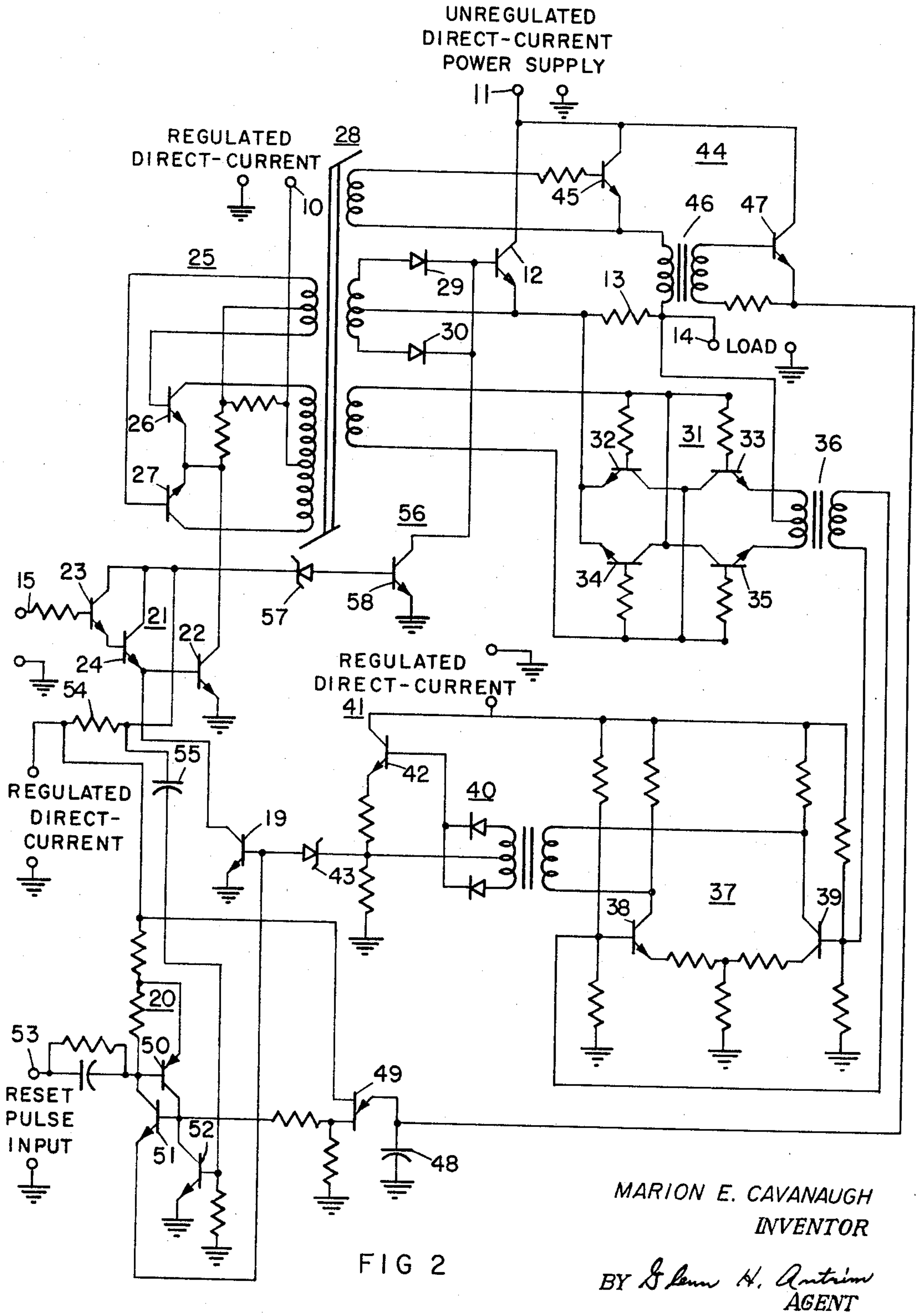

Other objects and advantages will be apparent from the specification and claims and from the accompanying drawing illustrative of the invention in which:

FIG. 1 is a block diagram of the transistor switching circuit of this invention; and FIG. 2 is a schematic circuit diagram of the transistor switch.

With reference to FIG. 1, a source of direct current has a terminal 11 connected through the emitter-collector circuit of a power transistor 12 and a voltage-sensing resistor 13 to an output load terminal 14. The transistor 12 is nonconductive until a control voltage is applied to input 15. A circuit 16 for supplying base current drive to transistor 12 operates in response to application of an "on" control signal to the input 15 to saturate fully the transistor 12 for connecting the terminal 11 of the direct-current source to the output load terminal 14.

A current control circuit 17 is connected between the voltage sensing resistor 13 and a multivibrator return shunt control circuit 19 that controls the output of the base current circuit 16. The circuit 17 operates to control the base current circuit 16 in response to a predetermined overload, that does not exceed the safe capacity of the transistor 12, to decrease the load current to an approximate maximum safe value for a load connected to terminal 14.

An overload protection circuit 18 has an input connected across the emitter-collector circuit of transistor 12 and an output connected to the multivibrator return shunt 19. In response to overload that is destructive, the latching circuit 20 of the overload protection circuit 18 operates to control the shunt circuit 19 to such an extent that the base current circuit 16 is disabled and base current drive is removed from the transistor 12 to cause it to become nonconductive and thereby to remove current from the external load. The latching circuit 20 remains operated until an operator applies a reset signal.

In detail, an input control terminal 15 is connected to the input of a direct-current amplifier 21; and a control circuit for changing the resistance of a multivibrator return circuit 22 is connected to the output of the amplifier 21. With reference to FIG. 2, the direct-current amplifier comprises type NPN transistors 23 and 24 that become conductive in response to application of positive voltage to the input 15. The output current from the emitter of the transistor 24 provides the base current for a transistor 22 so that it is conductive when an "on" signal is being applied to the input 15.

The multivibrator of FIG. 1 includes the transistors 26 and 27 that are coupled to windings of a transformer 28 in a conventional manner. The multvibrator converts efficiently direct current that is applied to terminal 10, from a regulated direct-current source, to square wave control voltages at the secondary windings of the transformer 28 that has a saturable core. One secondary is connected through diodes 29 and 30 to the base of the series transistor 12 to supply rectified current to the base. In response to an "on" signal being applied to input terminal 15, the multivibrator operates to supply sufficient base current for transistor 12 to saturate it for normal load current. While "on" signal is applied and transistor 22 is conductive, the multivibrator 25 also supplies at the secondary windings of the transformer 28 square-wave voltages for use in a chopper circuit in each of the control circuits 17 and 18.

The current-control circuit 17 regulates current at a predeteremined maximum value for the load as long as the power loss in the transistor 12 does not approach a value that exceeds its maximum dissipation. The voltage sensing resistor 13 that is in series with the load is connected across the input of the chopper 31. With reference to FIG. 2, the chopper circuit may contain four transistors 32–35 in a full-wave circuit. During substantially one-half period of a square wave of the multivibrator 25, the bases of the type NPN transistors 32 and 33 are positive with respect to the collectors to cause conduction. Although this is a reverse mode of operation from usual, the drive is sufficient to cause the emitter-collector circuits of the transistors 32 and 33 to be conductive. During this one-half period, a circuit for applying the voltage that is developed across the resistor 13 by load current may be traced from the terminal of the resistor that is connected to the load, through the upper half of the primary winding of the transformer 36, through the serially connected emitter-collector circuits of the transistors 32 and 33 and through resistor 13. During the succeeding one-half cycle, a similar circuit may be traced through the lower half of the primary winding of the transformer 36 and the emitter-collector circuits of the transistors 34 and 35. By using a full-wave circuit, overvoltage is sensed instantly regardless of the instantaneous polarity of the output wave of the multivibrator 25. Since little voltage loss occurs through the series emitter-collector circuits, substantially all the voltage that is developed across the resistor 13 appears across each one-half of the primary winding of the transformer 36 while its circuit is completed. Typically, the value of the resistor 13 may be only .001 ohm so that for 10 amperes of load current only 10 millivolts of control voltage is developed. By selecting each pair of serially connected transistors for matched characteristics, the effect of off-set voltage is substantially cancelled. For example, the off-set voltage of the transistor 32 is opposed by the off-set voltage of the transistor 33 in such a manner that typically the overall off-set voltage may not exceed 10 microvolts.

The chopped or interrupted control voltage from the chopper 31 is applied to an A-C amplifier 37 that in FIG. 2 is shown as a differential amplifier comprising transistors 38 and 39. The output of the A-C amplifier 37 is connected to a full-wave rectifier 40 and the output of the rectifier 40 is connected to a direct-current amplifier 41 having a transistor 42 and associated resistors. The output of the amplifier 41 is a direct-current voltage that changes in proportion to the current flow through the voltage sensing resistor 13 that is in series with the output load.

When the output of the amplifier 41 exceeds the breakdown voltage of a Zener diode 43 in response to current through the load exceeding its maximum rating, a multivibrator return shunt or transistor 19 becomes conductive and thereby functions to decrease the conductivity of the series transistor 22. With reference to FIG. 2, the output of the direct-current amplifier 41 is connected through the Zener diode 43 to the base-emitter circuit of the transistor 19. The emitter-collector circuit of the transistor 19 is shunted across the base-emitter circuit of the return-circuit transistor 22 so as to divert the current that normally flows through the base-emitter circuit of the transistor 22 while an "on" signal is applied to the control input 15. As the voltage across the series resistor 13 increases above a predetermined value, a greater proportion of the current that is supplied from the emitter circuit of the transistor 24 for the base-emitter circuit of the transistor 22 is diverted by transistor 19 so that the emitter-to-collector voltage drop across transistor 22 increases. This voltage drop is subtracted from the regulated supply voltage that is applied between terminal 10 and ground for energizing the multivibrator 25. As the supply voltage available to the multivibrator decreases, the amplitude of its output decreases to decrease the rectified voltage that is applied to the base of the transistor 12. The conductivity of the transistor 12 decreases to reduce the current flow to the load to a safe stable value as long as the power dissipation rating of the transistor 12 is not exceeded.

The overload protection circuit 18 also controls the multivibrator 25 through the shunting transistor 19. In response to an occurrence of an overload that must be terminated before sufficient time has elapsed to permit it to damage the transistor 12, the latching circuit 20 is operated to cause shunting transistor 19 to become conductive to such an extent that the base drive is removed from the transistor 12. Voltage for operating the latching circuit 20 is derived from the voltage drop across the emitter-collector circuit of the transistor 12. The input of the chopper, amplifier, and rectifier circuit 44 of FIG. 1 is connected to sense the voltage drop across transistor 12, and the output provides a direct-current voltage that is time delayed for operating the latching circuit 20.

As an example of specific circuitry, in FIG. 2, transistor 45 is connected in a circuit that functions as a chopper and an amplifier. Square-wave voltage from a winding of transformer 28 is applied between the base and emitter of the transistor 45. The emitter-collector circuit of the transistor 45 is connected in series with the primary winding of a transformer 46 and this series circuit is connected across a circuit that includes the emitter-collector circuit of the transistor 12 and the series voltage-sensing resistor 13. Interrupted current proportional to the current through the load that is connected to the terminal 14 is thereby applied to the primary winding of the transformer 46 while the multivibrator 25 is operating. The secondary winding of the transformer 46 is connected to the emitter-base circuit of a transistor 47 that functions as an amplifier and rectifier. The emitter-collector circuit is connected in series with a capacitor 48 that functions to delay operation of the latching circuit 20 inversely with the amount of overload. The control emitter circuit of a unijunction transistor 49 is connected in parallel with the capacitor 48. A base connection of the unijunction transistor 49 is connected to a regulated direct-current source rather than to the source that is connected to the load so that the unijunction transistor responds quickly to overloads that result when the voltage of the main source of power is high. While the capacitor charges at a rate dependent upon the amount of overload, the control voltage for the unijunction transistor 49 rises until the transistor is triggered to a conductive state for operating the latching circuit 20.

The latching or bistable circuit 20 as shown in FIG. 2 comprises transistors 50 and 51 of different types and a resetting transistor 52. Normally the transistors are nonconductive. In the circuit that is shown, the base and the collector of a type PNP transistor 50 is connected to the collector and the base respectively of a type NPN transistor 51. The output circuit for supplying a triggering pulse from the unijunction transistor 49 is also connected to the base of the transistor 51, and the emitter of the transistor 51 is connected to the base of the return shunt transistor 19 that is also, as described above, connected to the Zener diode 43 in the output circuit of the current control circuit 17.

In response to application of a positive pulse to the base of the transistor 51 from the output of the unijunction transistor 49 when it is triggered, current from a regulated direct-current supply flows through the serially connected transistors 50 and 51 and the base-emitter circuit of the shunt transistor 19. The current flow is sufficient to cause the emitter-collector circuit of the transistor 19 to divert enough current from the base-emitter circuit of the return circuit transistor 22 to prevent operation of the multivibrator 25 and thereby, to cause the transistor 12 to become nonconductive. Current is removed from the load until the latching circuit 20 is reset. A positive pulse may be applied to terminal 53 that is connected to the base of the transistor 50 to cause the transistors 50 and 51 to become normally nonconductive. The latching circuit is also automatically reset as the "on" signal is removed from the input control terminal 15. The current for transistors 23 and 24 of the direct-current amplifier that is controlled by the "off-on" signal, flows from the source of regulated direct current through a resistor 54. The junction of the collectors of the transistors 23 and 24 and the resistor 54 is connected through a capacitor 55 to the base of the reset transistor 52. The emitter-collector circuit of the transistor 52 is connected in parallel with the serially connected base-emitter circuits of the transistors 51 and 19. When the "on" signal is removed from the terminal 15, the current flow through the resistor 54 is interrupted and the voltage that is being applied from the regulated source through the resistor 54 to the capacitor 55 rises abruptly. A momentary impulse is therefore applied to the base of the transistor 52 to cause it to become conductive and to short-circuit the base emitter circuits of the transistors 51 and 19. The base current for transistor 51 is therefore diverted so that transistors 50 and 51 become nonconductive to remove the control current from the shunt transistor 19.

A clamping circuit 56 has a switching circuit connected between the base of the series transistor 12 and ground to function as a short-circuiting shunt except when an "on" signal is being applied to the input control terminal 15. In FIG. 2, a Zener diode 57 has one terminal connected to the junction of the voltage dropping resistor 54 and the collectors of the transistors 23 and 24, and has its other terminal connected to the base of a transistor 58. The emitter-collector circuit of the transistor 58 is connected between ground and the base of the series transistor 12. While the transistors 23 and 24 are conductive in response to application of "on" signal, the voltage drop across the resistor 54 is sufficient to decrease the voltage across the Zener diode 57 to a value less than its breakdown voltage and base current for transistor 56 is cut off. When an "on" signal is not applied to terminal 15 and the transistors 23 and 24 are nonconductive, the voltage drop across resistor 54 is small and the voltage applied across the Zener diode 57 and the base emitter circuit becomes sufficient to cause breakdown of the Zener diode 57. In response to breakdown of the Zener diode 57, the transistor 56 becomes saturated to provide a low-resistance path from the base of the transistor 12 for preventing leakage current.

The transistor switching circuit described above can be packaged compactly to replace mechanical contacts where switching circuits that are free from switching transients are to be used. In addition to eliminating transients, it also provides protection for the load circuits by regulating load current to a maximum safe value for the load providing the overload is not so great that the transistor 12 might be damaged. The load may become excessive because the instances of the load becomes excessively low or the unregulated voltage becomes excessively high. When the power dissipated in the transistor 12 exceeds its safe rating, the latching circuit 20 is operated after an interval according to the amount of the overload. The charging of the capacitor 48 is faster for a greater overload. Since the triggering of the unijunction transistor 49 is dependent upon the ratio of its anode voltage to its emitter voltage, its anode is connected to a regulated power supply so that the unijunction transistors senses quickly voltage changes applied to its emitter from the capacitor 48 as a result of overloads that are caused or increased by high voltage of the main power supply. After the latching circuit has operated, the load remains disconnected from the power supply until the latching circuit is reset, generally after a fault has been corrected.

While only one embodiment of the invention, together with modifications thereof, has been described in detail herein and shown in the accompanying drawing, it will be evident that various further modifications are possible in the arrangement and construction of its components without departing from the scope of the invention.

I claim:

1. In a switching system having a series transistor with an output circuit that functions as a switching circuit to be connected in series with a load and a source of current, said transistor having a control circuit responsive to the application of current to close said switching circuit, a sensing resistor connected in series with said series transistor, a direct-current converter for converting current from a source of current to direct current in the amount required for said control circuit of said series transistor, said direct-current converter having a current output circuit and an amplitude control circuit, said current output circuit being connected to said control circuit of said series transistor, an amplitude control transistor having an input circuit and an output circuit, said amplitude control circuit being connected to said output circuit of said amplitude control transistor, said amplitude control transistor functioning as an amplitude control for said direct-current converter, current amplifier control means having an output connected to said input circuit of said amplitude control transistor and a control input connected to receive an on-control input signal, a shunt control transistor having an input circuit and and a controlled resistance output circuit, said controlled resistance output circuit being connected to said input circuit of said amplitude control transistor, voltage amplifier means having an input circuit connected across the output circuit of said series transistor and an output circuit connected to said input circuit of said shunt control transistor, said voltage amplifier means including a breakdown switching element operable for applying a predetermined output current from said amplifier means to said input circuit of said shunt control transistor in response to the voltage across the output circuit of said sensing resistor rising above a predetermined overload value, the conductivity of said shunt control transistor changing in response to application of current from said amplifier means when said breakdown switching element is operated to change the conductivity of said amplitude control transistor sufficiently to decrease abruptly the amount of current that is being applied from said direct-current converter to said series transistor, and said series transistor responding to the abrupt decrease in current flow from said direct-current converter to open said switching circuit.

2. In a switching system as claimed in claim 1 having a series resistor connected in said switching circuit to be connected in series with a load and a source of current, a breakdown diode, amplifier means having an input connected across said series resistor to sense current flow through said load and an output connected through said breakdown diode to said input circuit of said shunt control transistor, the conductivity of said shunt control transistor changing in response to a change in current through said series resistor after the current load has risen above a predetermined overload level, thereby changing the resistance of said controlled resistance output circuit of said shunt control transistor that controls the amount of flow of direct current from said direct-current converter to said series transistor, the resistance of said output circuit of said series transistor increasing in response to an increase of current above said predetermined overload level through said series resistor to regulate current supplied to said load.

3. In a switching circuit having a series transistor comprising:

a power transistor for switching having at least an emitter, a base, and a collector, a source of power, a load, a series resistor and the emitter-collector circuit of said transistor being connected in series, a signal generator with a biasing control circuit and rectifier means having an output connected to the base of said transistor, biasing means for said signal generator having an on-off control input and an output connected to said biasing control circuit of said signal generator, said signal generator being operative in response to said biasing means being in an on-control state and inoperative in response to said biasing means being in an off-control state, said transistor being nonconductive in response to said signal generator being inoperative and being conductive at a point of saturation in response to said signal generator being operative, a shunt control circuit connected to said control input of said biasing means, a direct-current amplifier having an input connected to said series resistor and an output connected to said shunt control circuit, said shunt control circuit in response to output current through said series transistor rising above a predetermined overload value decreasing the output of said signal generator, thereby decreasing the conductivity of said transistor to decrease the output current to said load.

4. In a switching circuit as claimed in claim 3, sensing means for sensing voltage drop across the emitter-collector circuit of said transistor, a latching circuit coupled to said sensing means operable from a normal state to an overload state in response to voltage applied from said emitter-collector circuit to said sensing circuit increasing to a destructive value, the output of said latching circuit being connected to said shunt control circuit, said shunt control circuit operating to an overload state in response to said latching circuit being operated to an overload state, and said signal generator being disabled to prevent conduction of load current through said transistor in response to operation of said shunt to its overload state.

5. In a switching circuit having a first series transistor, and a load, said transistor having an emitter, a base, and a collector, the emitter-collector circuit of said first transistor, and said load being connected in series for connection to a source of current, a multivibrator, a rectifier, the output of said multivibrator being connected through said rectifier to said base of said first transistor, said multivibrator being operative to an on-condition to apply sufficient bias to said base of said first transistor to maintain a saturated condition for any normal load current therethrough, a second transistor having an emitter, a base, and a collector, said multivibrator having a current return circuit completed through the emitter-collector circuit of said second transistor, means responsive to on-off control connected to said base of said second transistor to control the conductivity of said second transistor, said second transistor becoming conductive in response to said means being operated to an on-state to maintain said first transistor saturated for any normal load current therethrough and becoming non-conductive to cut-off said first transistor in response to said means being operated to an off-state.

6. A switching circuit according to claim 5, including a series resistor, said series resistor being connected in series with said load and said emitter-collector circuit of said first transistor, amplifier means having an input connected across said series resistor and an output connected to said base of said second transistor, said amplifier operating in response to an increasing load current above a predetermined maximum normal value to decrease gradually the base current of said second transistor, thereby decreasing the output of said multivibrator and the load current through said first series transistor.

7. A switching circuit according to claim 5 including an amplifier means having an input connected to sense voltage drop between the emitter and the collector of said first series transistor, a bistable electronic switch having a first control circuit connected to the output of said amplifier means, a second control circuit for connection to a reset input, and an output circuit connected to said base of said second transistor, said bistable electronic switch normally being an open circuit for said base of said second transistor, said bistable switch being operated by application of output from said amplifier means in response to the voltage drop between the emitter and the collector of said second transistor exceeding a predetermined value, said output circuit of said bistable switch while said bistable switch is operated shunting said base circuit of said second transistor to decrease its conductivity substantially so that said multivibrator becomes inoperative and said first series transistor becomes nonconductive for disconnecting said load from said source of current, and said bistable circuit remaining inoperative until reset signal is applied to said reset input.

References Cited

UNITED STATES PATENTS

| | | | |
|---|---|---|---|
| 2,980,845 | 4/1961 | Thompson et al. | 317—33 |
| 3,122,697 | 2/1964 | Kauders | 323—22 |
| 3,215,896 | 11/1965 | Shattuck et al. | 317—16 |
| 3,235,787 | 2/1966 | Gordon et al. | 323—22 |
| 3,262,015 | 7/1966 | McNamee et al. | 317—33 |
| 3,303,388 | 2/1967 | Means | 317—33 |

LEE T. HIX, *Primary Examiner.*

R. V. LUPO, *Assistant Examiner.*